United States Patent [19]

Kondo

[11] Patent Number: 4,913,334
[45] Date of Patent: Apr. 3, 1990

[54] DEVICE FOR CORRECTING WARP OF PRINTED CIRCUIT BOARDS IN A CARRIERLESS SOLDERING APPARATUS

[75] Inventor: Kenshi Kondo, Tokyo, Japan

[73] Assignee: Nihon Den-Netsu Keiki Co., Ltd., Tokyo, Japan

[21] Appl. No.: 298,163

[22] Filed: Jan. 18, 1989

[30] Foreign Application Priority Data

Jan. 19, 1988 [JP] Japan ................... 63-7430
Jan. 19, 1988 [JP] Japan ................... 63-7431

[51] Int. Cl.[4] .............................. B23K 37/04
[52] U.S. Cl. ....................... 228/47; 228/57; 228/180.1; 29/566.3
[58] Field of Search .......... 228/47, 57, 36, 37, 228/160, 179, 180.1; 29/566.3, 835, 838, 839

[56] References Cited

U.S. PATENT DOCUMENTS

| | | | |
|---|---|---|---|
| 4,408,560 | 10/1983 | Caratsch | 228/47 |
| 4,620,663 | 11/1986 | Odashima et al. | 228/44.7 |
| 4,769,083 | 9/1988 | Tiritilli | 228/37 |
| 4,807,794 | 2/1989 | Hess | 228/37 |

Primary Examiner—Richard K. Seidel
Assistant Examiner—Samuel M. Heinrich
Attorney, Agent, or Firm—Stephen F. K. Yee

[57] ABSTRACT

A device for correcting warp of printed circuit boards in carrierless soldering apparatus wherein the printed circuit boards are soldered while being held by holding claws of a conveying means is disclosed, which comprises a sliding means involving a single or plural warp-correcting means, sliding plates for installing the warp-correcting means thereon, and a single or plural pairs of slide beds provided in parallel to the direction of movement of the printed circuit boards, and a driving means for reciprocating the slide means in parallel to the direction of movement of the printed circuit boards.

6 Claims, 12 Drawing Sheets

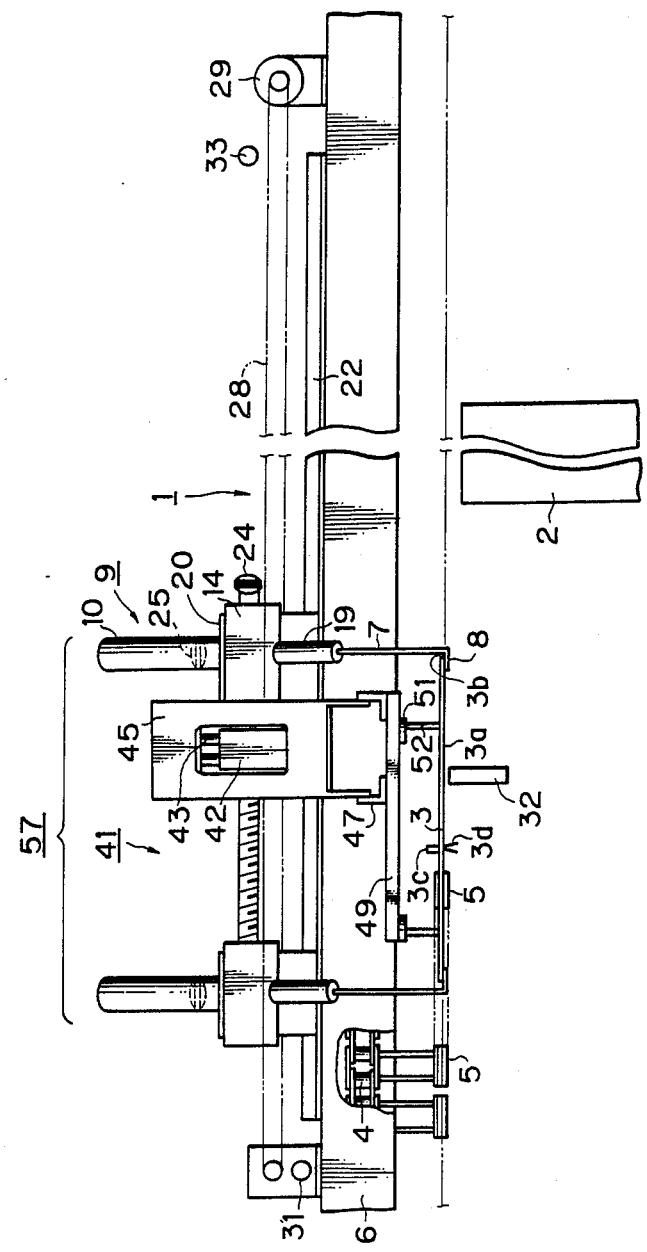

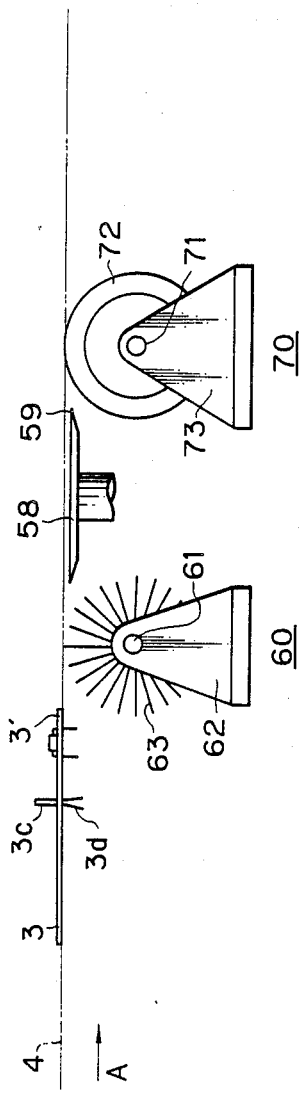

DEVICE FOR CORRECTING WARP OF PRINTED CIRCUIT BOARDS IN A CARRIERLESS SOLDERING APPARATUS

BACKGROUND OF THE INVENTION

The present invention relates to a device for correcting warp of printed circuit boards in a carrierless soldering apparatus. More particularly, the present invention relates to a device for correcting the upward and/or downward warping of printed circuit boards provided thereon with electronic parts during or after the soldering treatment in a carrierless soldering apparatus.

Field of the Invention

In order to prevent a printed circuit board from warping caused by the heat of molten solder, a long, plate-like warp-preventing means has been used in the past, which is arranged above a solder tank to be parallel in its longitudinal direction with the direction of movement of the board to be transferred and approximately at the same level as that of the molten solder in the solder tank where the molten solder is allowed to circulate strongly and overflow, whereby the means is brought into contact with the lower surface of the board being moved (Japanese Laid-open Utility Model Appln. No. Sho. 56-152161.

In a conventional carrierless soldering apparatus, L-shaped warp-preventing plates are also used with a view to preventing a printed circuit board from warping caused by the heat of the molten solder or straightening a warped circuit board in such manner that both side edge portions of the board, in transverse direction to the direction of movement of the board, are allowed to rest on the plates. More precisely, this manner involves the steps of setting the warp-preventing plates in a position spaced by a given distance in longitudinal direction of the circuit board from both end portions of the circuit board, allowing the plates to descend by the action of a first driving means such as an air cylinder, moving the plates horizontally by the action of a second driving means such as an air cylinder above the position where the circuit board is to be supported on both edge portions of each plate, and elevating the plates by the action of the first driving means so that the board may be supported on both edge portions of the plates (Japanese Laid-open Patent Appln. No. Sho. 60-27188).

In the prior art warp-preventing means constructed as above, however, a problem arises in that some or all of the electronic parts and incidental lead wires mounted to a printed circuit board are brought into contact with the warp-preventing means, depending on the arrangement of the parts, thus disturbing the soldering treatment of the circuit board. In case of using the warp-preventing plates, another problem arises in that the soldering apparatus has to be provided separately with a first driving means for moving the warp-preventing plates up and down a the second driving means for moving the plates horizontally, thus rendering the structure of the soldering apparatus and the operation of the warp-preventing plates rather complicated. Further, printed circuit boards undergo upward or downward warping depending on the kind or nature thereof. Accordingly, a problem also arises in the conventional warp-preventing means which is effective exclusively for preventing downward warping of the circuit boards because it cannot prevent the occurrence of upward warping (or camber) of the circuit boards or cannot straighten upwardly warped circuit boards.

When printed circuit boards have undergone warping by the influence of heat on soldering, such warped circuit boards cannot uniformly be treated in the subsequent step where lead wires extending from the lower surface of the soldered circuit board are cut off uniformly by a rotating cutter positioned just below the circuit board along the path of its movement.

In case the circuit board has been warped downwardly during the soldering treatment so that the lead wires extending from the bottom of the circuit board cannot be cut off uniformly in the subsequent treatment, a warp-straightening device as shown in FIG. 12 is used in the prior art. In the soldering apparatus shown in FIG. 12 in which a solder tank is not shown for brevity and for simply depicting the structure of a device for straightening the downward warp of circuit boards, the apparatus involves a printed circuit board 3 having a front edge portion 3' relative to its moving direction shown by an arrow mark A, electronic part 3c and lead wires 3d, a conveying device 4, a cutter 58 with a circular cutting blade 59 and one or more of the warp-straightening devices 60 and 70. In this drawing, the devices 60 and 70 are used after the soldering treatment and prior to the treatment for cutting the lead wires extending from the bottom of the board 3. In the device 60 for straightening the downward warp of the circuit board 3, a rotary shaft 61 has radially arranged plural pins 63 and is mounted on a support 62. In the device 70 used for a similar purpose, a rotary shaft 71 has a wheel-like rotary plate 72 and is mounted on a support 73. By the use of the warp-straightening device 60 or 70, the downward warp of the circuit board formed as a result of the thermal deformation of the circuit board during the soldering treatment can properly be straightened in such manner that the rotary pins 63 and/or the rotary plate 72 are/is brought into contact with the lower surface of the circuit board whereby a strong upwardly acting force is exerted on the downwardly warped portion of the board to flatten it. However, these devices 60 and 70 involve some defects; firstly, upwardly warped or cambered circuit boards cannot be flattened by the use of these device( 60 and 70. Secondly, the device 60 or 70 is interposed between a solder tank and a cutter and installed at a fixed position, so that the device cannot be used for preventing the formation of any warp in circuit boards during the soldering treatment. Further, when the circuit boards are once warped during the soldering treatment, correction of the warp cannot completely be made by the use of the device 60 or 70 so that the lead wires 3d may be cut slantingly or in some cases may not be cut off uniformly on account of vibration caused by the rotation of the cutter 58.

In order to prevent completely circuit boards from warping during the soldering treatment, the warp-preventing device should be movable together with the circuit board moving along the predetermined path in the apparatus and continuously support the boards in a flattened state until the soldered circuit board is cooled. Under the circumstances, there is a great demand for developing a new device for correcting warp of printed circuit boards which overcomes the drawbacks in the prior art devices.

SUMMARY OF THE INVENTION

The present invention has been accomplished to solve the above mentioned problems. It is an object of this invention to prevent printed circuit boards from downward warping and/or to straighten up downwardly warped circuit boards by supporting the supporting portions of warp-correcting rods in contact with the lower surface of both edge portions of the circuit boards in transverse direction to the direction of movement of the circuit boards while allowing them to move forward. It is another object of this invention to provide the warp-correcting device with an adjusting means capable of adjusting the space between the supporting portions in accordance with the distance between both edge portions. It is still another object of this invention to provide in a carrierless soldering apparatus a camber-correcting device capable of preventing printed circuit boards from upward warping or straightening upwardly warped circuit boards which comprises a pin to be brought into contact with the upper surface of the circuit boards for pushing them downwardly. It is further object of this invention to provide in a carrierless soldering apparatus a combination of the devices for correcting upward and downward warping of printed circuit boards simultaneously.

In accordance with the present invention, there is provided a device for correcting warp of printed circuit boards in a carrierless soldering apparatus wherein the printed circuit boards are soldered while being held by holding claws of a conveying means, which comprises a sliding means involving a single or plural warp-correcting means, sliding plates for installing the warp-correcting means thereon, and single or plural pairs of slide beds provided in parallel to the direction of movement of the printed circuit boards, and a driving means for reciprocating the sliding means in parallel to the direction of movement of the printed circuit boards.

In one embodiment of the present invention, the warp-correcting means is a means for correcting downward warp of printed circuit boards and comprises warp-correcting rods each having a supporting portion formed at the lower end thereof and adapted to contact with the lower surface of the printed circuit board at both lateral edge portions thereof transverse to the direction of movement of the circuit board, a reciprocating unit for moving the warp-correcting rod up and down axially, and a turning unit for turning the warp-correcting rod around the axis thereof.

In another embodiment of the present invention, the warp-correcting means is a means for correcting upward warp of printed circuit boards and comprises one or more pins for pushing the upper surface of the printed circuit boards downwardly, a vertically movable plate for mounting the pin or pins thereto, and a driving means for moving the movable plate up and down.

In still another embodiment of the present invention, the warp-correcting means is a combination of the means for correcting downward warp of printed circuit boards and the means for correcting upward warp of printed circuit boards and these means are arranged preferably in the same or adjacent slide beds.

In the present invention, the sliding plates are featured by being mounted onto the slide beds in such manner that the sliding plates are slidably movable in the lateral direction relative to the direction of movement of the printed circuit boards.

In the present invention, the slide beds are featured by being provided with a means for adjusting the space between them.

By the term "warp-correcting", for example, in the word "warp-correcting means", is meant herein both of the meanings "warp-preventing" and "warp-straightening".

Using a carrierless soldering apparatus, soldering of printed circuit boards is effected in a continuous mode. In this case, the printed circuit boards are held at their longitudinal edges in parallel to the direction of movement thereof by holding claws and moved along a pair of guide rails by way of a conveyer chain, through a molten solder bath where soldering of the circuit boards involving electronic parts and lead wires is effected. The soldered circuit boards are then cooled and subjected to an after-treatment with a cutter to eliminate lead wires or the like extending from the circuit boards. In order to prevent any thermal deformation, i.e. warping of the printed circuit boards by the heat of the molten solder, the device for correcting warp of the printed circuit boards of this invention is preferably used during the soldering treatment. For the purpose of straightening warped circuit boards, the device of this invention is used after the soldering treatment but prior to the cutting treatment. The device of this invention may be positioned in the production line during and after the soldering treatment to remove the problem of warping completely.

In practice of the present invention, the sliding plates are first moved so that the supporting portion of the warp-correcting rods come to the predetermined positions below the printed circuit board and an adjusting means mounted to the slide beds is then manipulated to adjust the space between a pair of the slide beds. The means for correcting downward warping of the circuit board is then actuated whereby the supporting portions of the rods are allowed to descend below the predetermined position of the circuit board. At this stage, the turning unit is actuated to rotate the warp-correcting rods around the axis thereof, and the warp-correcting rods are allowed to ascend until they are brought into contact with the lower surface of the printed circuit board. The driving means is then actuated so that a pair of the slide beds are moved together with the circuit board along the guide rails. In case the means for correcting upward warping of the printed circuit board is used instead or together with the above device for correcting downward warping, the movable plate is allowed to descend whereby the pins push the upper suface of the circuit board downward. Further, the driving means is manuipulated to move the slide beds together with the circuit board which is in the state pushed by the pins downwardly. In case both types of warp-correcting means are used, these means are mounted to the same or adjacent slide beds and moved along the guide rails together with the circuit board. In this manner, the printed circuit boards are prevented from downward and/or upward warping, and the circuit boards which have undergone downward and/or upward warping can be straightened.

BRIEF DESCRIPTION OF THE DRAWINGS

The present invention can more fully be understood from the following description taken in conjunction with the accompanying drawings in which:

FIG. 6 is a side elevational view showing another embodiment of the device of this invention provided with a combination of the upward warp-correcting means and the downward warp-correcting means.

FIG. 12 is an explanatory diagram showing the conventional device provided with two kinds of downward warp-correcting means.

DESCRIPTION OF THE PREFERRED EMBODIMENTS

Figure 1:
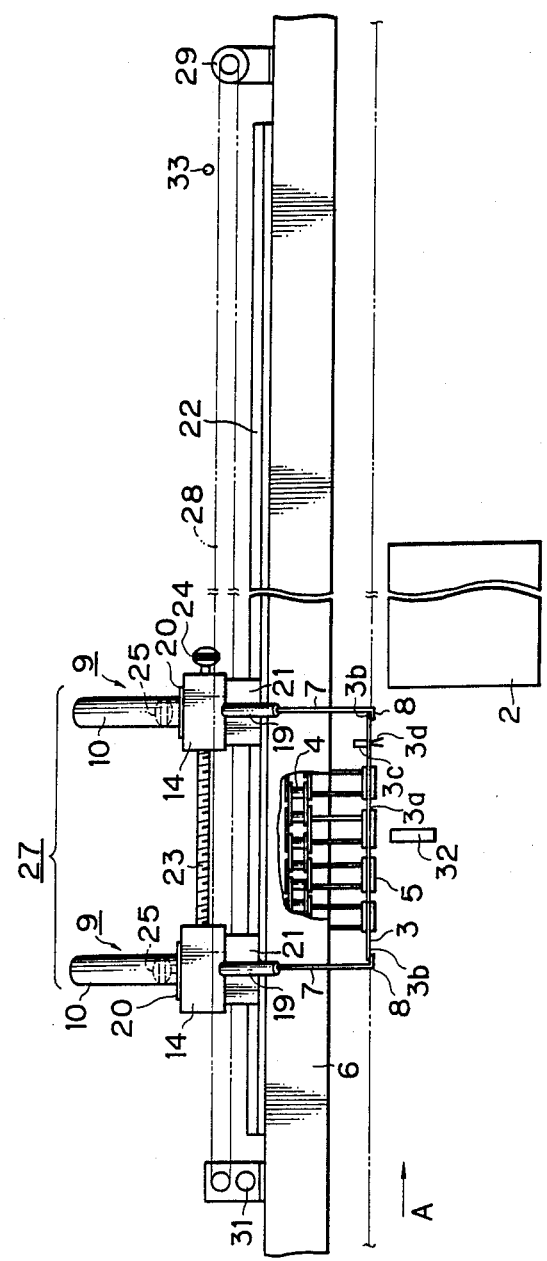
FIG. 1 is a side elevational view of one embodiment of the device.
Figure 2:
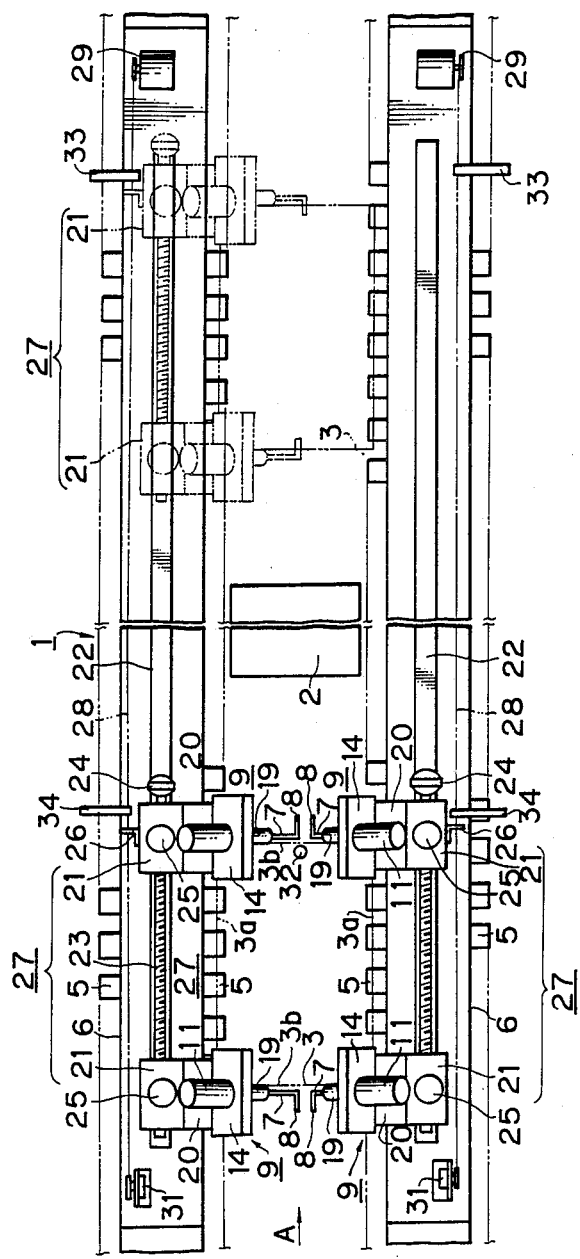
FIG. 2 is a plan view of the device shown in FIG. 1.
Figure 3:
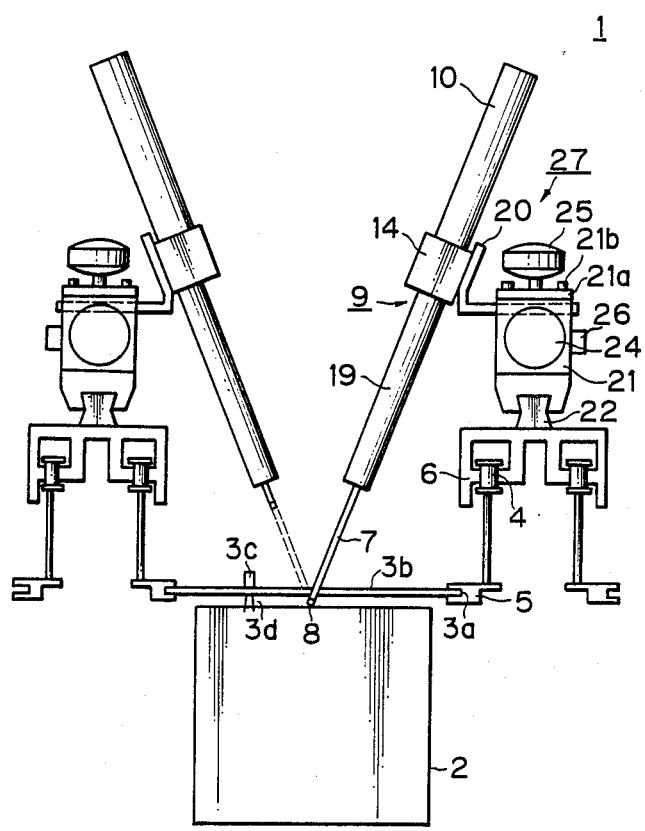
FIG. 3 is an enlarged front view showing the principal parts of the device shown in FIG. 1.

In FIGS. 1-3, wherein parts for after-treatments such as a cutter are excluded for brevity, the reference numeral 1 denotes a carrierless soldering apparatus, 2 a solder tank of the soldering apparatus 1, and 3a printed circuit board having longitudinal side edge portions 3a parallel to the direction of movement thereof (the direction shown by the arrow A), and lateral side edge portions 3b transverse to the direction of movement. Reference numeral 3c denotes electronic parts arranged on the circuit board, 3d lead wires, 4 a conveyor chain for the printed circuit board in the apparatus, 5 a holding claw adapted to engage with the printed circuit board 3 at the longitudinal side edge portions thereof for holding it, 6 a guide for the conveyor chain 4, 7 a warp-correcting rod for preventing the printed circuit board 3 from downward warping or for straightening downwardly warped printed circuit board 3, 8 an L-shaped supporting portion formed at the lower end of the warp-correcting rod 7 and adapted for contacting with the lower surface of the printed circuit board 3 to support it, and 9 a means for correcting downward warp of printed circuit boards which actuates the warp-correcting rod 7. The details of the means 9 for correcting downward warp of printed circuit boards are shown in FIGS. 4 (a), (b) and (c).

Figure 4A:
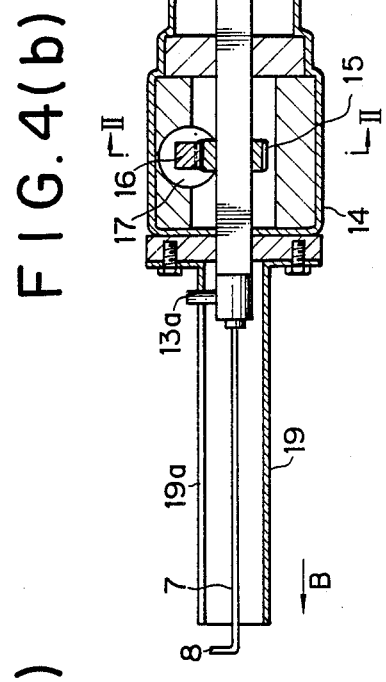
FIGS. 4(a), 4(b) and 4(c) are enlarged views of the principal parts of the device shown in FIG. 3, with FIG. 4(a) being a front view and FIG. 4(b) and 4(c) being sectional views.
Figure 4B:
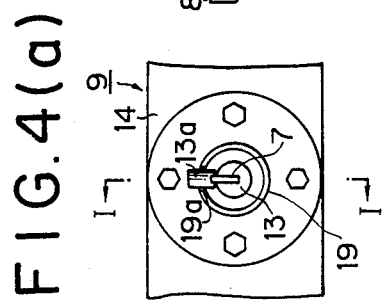
Figure 4C:
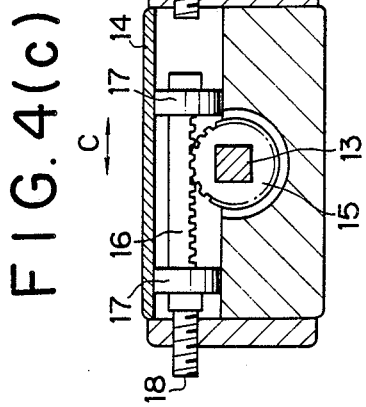

FIG. 4(a) is a front view of the means 9 for correcting downward warp, FIG. 4 (b) is a sectional view taken along the line I—I in FIG. 4(a), and FIG. 4(c) is a sectional view taken along the line II—II in FIG. 4(b).

The reference numeral 10 denotes a reciprocating unit to which the warp-correcting rod 7 is mounted, with the supporting portion 8 thereof facing downwards (the direction shown by the arrow mark B in FIG. 4(b)), the unit being cable of moving the warp-correcting rod 7 up and down axially, 11 a cylinder, 12 a piston, 13 a rod having a guide pin 13a mounted thereto and the warp-correcting rod 7 firmly secured thereto by screw threads or the like means, 14 a turning unit for turning the warp-correcting rod 7 around the axis thereof, 15 a pinion engageable with a rack 16, to which the rod 13 is integrally secured, 17 a piston capable of reciprocating in the direction shown by the arrow mark C in FIG. 4(c) to turn the rod 13 through the action of the rack 16 and the pinion 15, 18 a screw for adjusting the stroke of the piston 17, 19 a protective pipe for protecting the warp-correcting rod 7, and 19a a cutout formed longitudinally in a part of the protective pipe 19, which serves as a guide for the guide pin 13a of the rod 13. In FIGS. 1-3, the reference numeral 20 denotes a sliding plate having the means 9 for correcting downward warp of the circuit board installed thereon, 21 a pair of slide beds each provided parallel to the direction of movement of the printed circuit board 3, to which the sliding plates 20 are mounted slidably in transverse direction to the direction of movement of the printed circuit board 3, 21a a retainer plate for mounting the sliding plate 20 onto each of the slide beds 21, 21b fixing screws for fixing the retainer plate 21a, 22 a guide rail on which a pair of the slide beds 21 are set and travel, 23 a screw threaded rod attached to a pair of the slide beds 21 for regulating and setting the space between the slide beds 21 in compliance with the distance between the lateral edge portions 3b of the printed circuit board 3, 24 a knob for turning the screw-threaded rod 23, 25 a setscrew for fixing the sliding plate 20 after it has been adjusted and set at a predetermined position, 26 an attachment piece attached to each of the pair of slide beds 21, and 27 an entire sliding means constructed integrally by connecting the slide beds 21 by means of the screw-threaded rod 23. Reference numeral 28 denotes an endless conveyor chain for moving the sliding means 27, a part of which is firmly secured to the attachment piece 26. Reference numeral 29 denotes a motor capable of rotating normally or reversely for driving the conveyor chain 28 forwards, i.e. in the direction shown by the arrow mark A, and backwards. Thus, a driving means is constructed by the conveyor chain 28 and the motor 29. Reference numeral 31 denotes an encoder capable of detecting the moving speed of the printed circuit board 3 and synchronizing the moving speed of the sliding means 27 with that of the printed circuit board 3. Reference numeral 32 indicates a first detector capable of detecting that the front edge portion 3b of the printed circuit board 3 moving in the direction shown by the arrow mark A has been moved to the front warp-correcting rod 7, and actuating the means for correcting downward warp of the circuit board and then allowing the motor 29 to start, 33 a second detector capable of detecting the front slide bed 21 moving forwards in the direction shown by the arrow mark A together with the printed circuit board 3 which has been soldered, and stopping and reversely rotating the motor 29 at this stage, 34 a third detector capable of detecting that the front slide bed 21 moved in the direction shown by the arrow mark A has been returned to its original position, and then stopping the rotation of the motor 29.

The operation of the device of this invention will now be described below.

Prior to the soldering treatment in the solder tank 2, the knob 24 attached to the screw threaded rod 23 is turned to set the space between the slide beds 21 so that the lateral edge portions 3b of the printed circuit board 3 may be supported by the supporting portions 8 of the warp-correcting rods 7. The setscrew 25 is then loosened and the sliding plates 20 are allowed to slide and finally set at the position of the rear lateral edge portion 3b of the printed circuit board 3.

The moving speed of a first circuit board 3 engaged with the holding claws 5 and moved in the direction shown by the arrow mark A is detected with the aid of the encorder 31 and the rotational speed of the motor 29 is automatically controlled so that the sliding means 27 may be moved at the same speed as that of the printed circuit board 3.

Next, the operation of the warp-correcting rod 7 will be described with reference to FIGS. 5(a)-5(e).

Figure 5A:
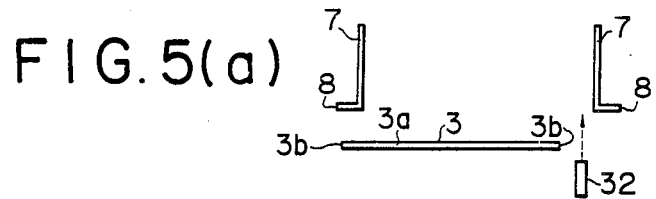
FIGS. 5(a)–5(e) are explanatory diagrams showing stepwise the operation of the warp-correcting rods acting for correcting downward warp of a printed circuit board.
Figure 5B:
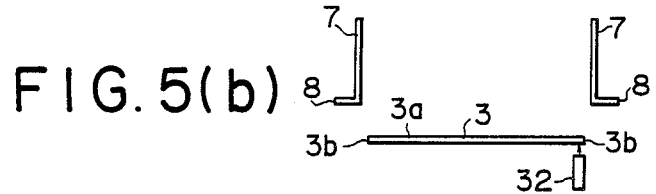
Figure 5C:
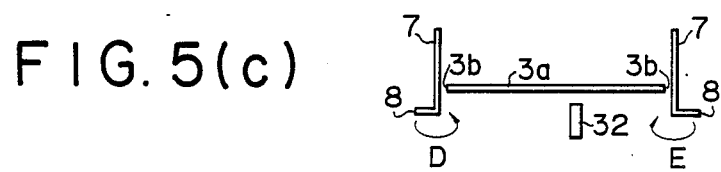
Figure 5D:
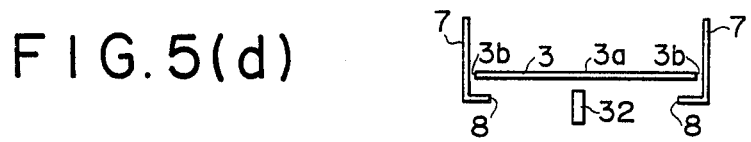
Figure 5E:

FIG. 5(a) shows the state of the printed circuit board 3 which has been moved close to the first detector 32 located below the front warp-correcting rod 7. As shown in FIG. 5(b), the front lateral edge portion 3b of the printed circuit board 3 is detected by means of the first detector 32, and at the same time, the motor 29 shown in FIG. 2 is allowed to start so as to move one of the sliding means 27 (located on the left side relative to the direction shown by the arrow mark A in FIG. 2) at the same speed as that of the printed circuit board 3. Subsequently, the reciprocating units 10 of the means 9 for correcting downward warp of the circuit board as shown in FIG. 4(b) are actuated to allow the supporting portions 8 of the warp-correcting rods 7 to descend below the printed circuit board 3 as shown in FIG. 5(c). Next, the turning units 4 as shown in FIGS. 4 are actuated to turn the warp-correcting rods 7 as shown by the curved arrow marks D and E to the positions as shown in FIG. 5(d) The reciprocating units 10 are then actuated to move the warp-correcting rods 7 upwards as shown in FIG. 5(e) whereby the supporting portions 8 thereof come into contact with and support both of the lateral edge portions 3b of the printed circuit board 3 which is continuously moved together with the sliding means 27 and is soldered in the solder tank 2.

After completion of the soldering, the warp-correcting rods are actuated in the steps reverse to those shown in FIG. 5(a)–5(e) so that they may be detached from the printed circuit board and returned to their original positions. When the printed circuit board 3 has been soldered and the moving sliding means 27 has approached to a position shown by a two-dot chain line in FIG. 2, the front slide bed 21 is detected by means of the second detector 33 so as to stop the moving sliding means 27 and release the supporting portions 8 of the warp-correcting rods 7 from the printed circuit board 3. The printed circuit board 3 is continuously moved in the direction shown by the arrow mark A and conveyed to a cooling means (not shown) in the next step. When the sliding means 27 is stopped, the motor 29 is rotated reversely to move the sliding means 27 in the opposite direction to the direction shown by the arrow mark A. When the sliding means 27 has returned to its original position, the third detector 34 detects and stops the front sliding bed 21 in the direction shown by the arrow mark A.

Next, a second printed circuit board 3 which has been conveyed to the apparatus is treated with another sliding means 27 located on the right side relative to the direction shown by the arrow mark A in FIG. 2 and is soldered according to the same operation as described above, and the sliding means 27 is then returned to its original position. When the sliding means 27 is returned to its original position, i.e. when it is moved in the opposite direction to that shown by the arrow mark A, the sliding means 27 is returned preferably at a higher speed by increasing the reverse rotational speed of the motor 29. The returned sliding means 27 can immediately be used for a third printed circuit board 3.

As shown in FIGS. 2 and 3, the sliding means 27 are provided on both sides with reference to the direction of movement (the direction shown by the arrow mark A in FIG. 2) of the printed circuit board 3 in the soldering apparatus 1. Thus, two pairs of the means 9 for correcting downward warp of the circuit boards and the warp correcting rods 7 are installed obliquely with their supporting positions 8 facing downwards. This is to prevent the two pairs of the means 9 for correcting downward warp of the circuit boards 3 and the warp-correcting rods 7 from collision against each other when the sliding means 27 on both sides are moved in the opposite directions to each other. In case the sliding means 27 is provided only on one side (for example, on the left side relative to the direction shown by the arrow mark A), there is no inconvenience even if the means 9 for correcting downward warp of the circuit board 3 and the warp-correcting rods 7 are provided vertically.

Figure 7:
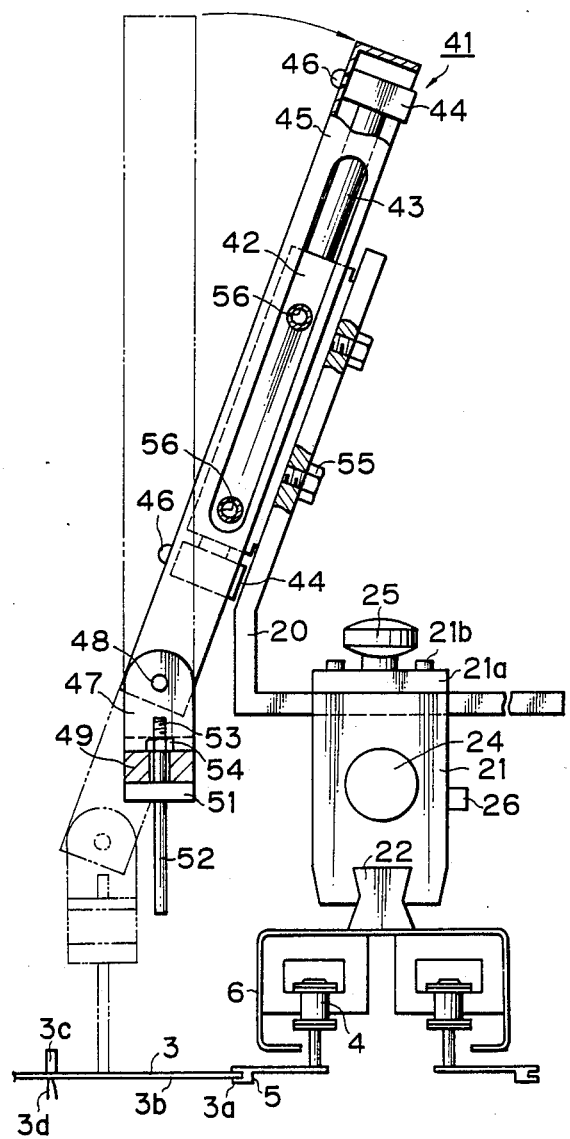
FIGS. 7, 8 and 9 are enlarged, front view, side elevational view and perspective view, respectively, showing the principal part of the device shown in FIG. 6.
Figure 8:
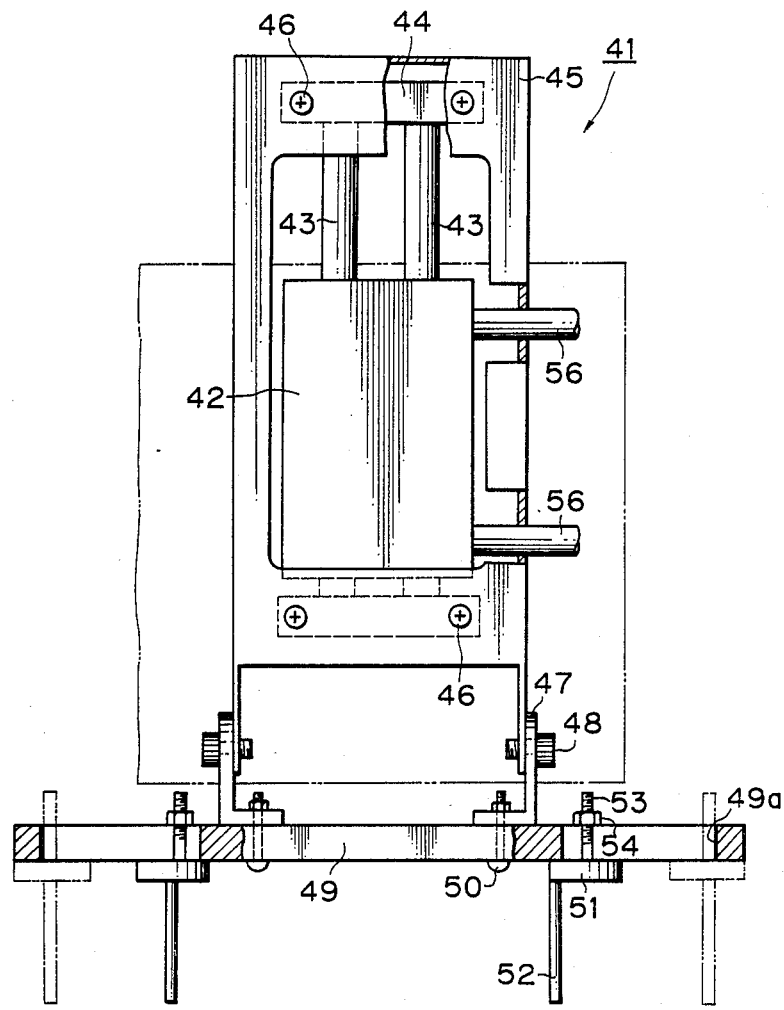
Figure 9:
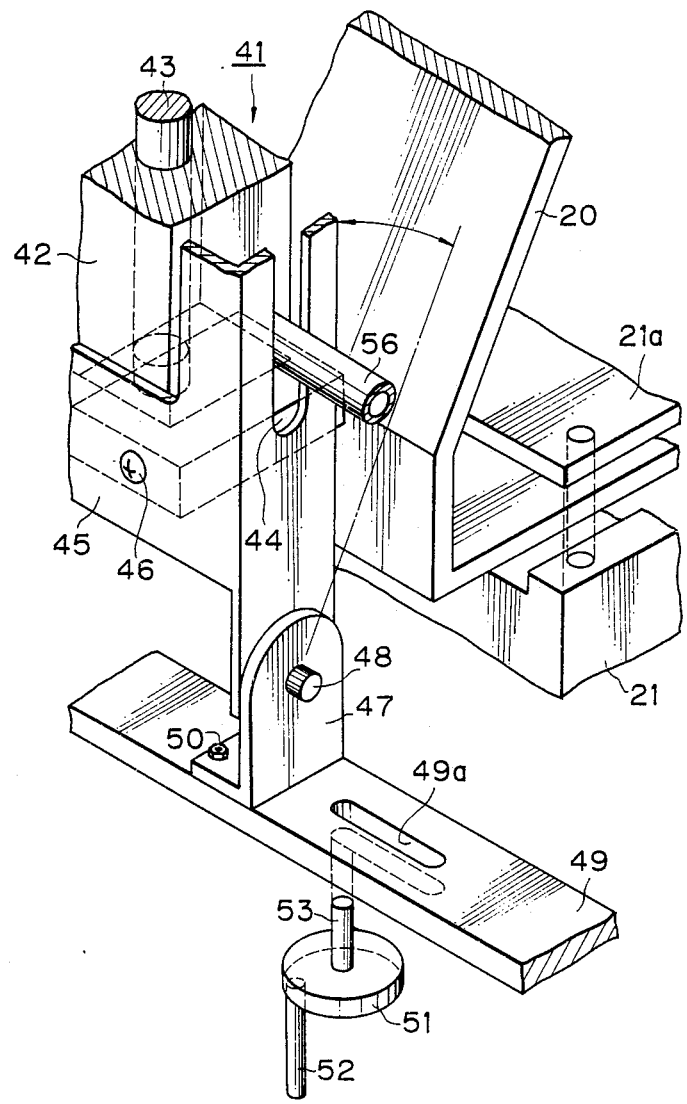

FIG. 6 is a side elevational view of another embodiment of the device of this invention and FIGS. 7, 8 and 9 are enlarged front view, side elevational view and perspective view showing the principal parts of the device shown in FIG. 6. In these drawings, the components indicated by the same reference numerals as those used in FIGS. 1, 2 and 3 denote the same components. Reference numeral 41 denotes a means for correcting upward warp of the circuit boards which is used to prevent the circuit board 33 from upward warping or straighten upwardly warped circuit board 3 and which is provided on the sliding plate 20 adjacent to the means 9 for correcting downward warp of the circuit board 3. Reference numeral 42 denotes a cylinder for use in the means 41 for correcting upward warp of the circuit board, an example of which is an air cylinder, and 43 a rod for the cylinder 42. A piston, not shown, is slidably placed in the cylinder 42. A driving means for reciprocating the rod 43 is constructed by the cylinder 42 and the rod 43. Reference numeral 44 indicates fixing means integrally secured to the upper and lower portions of the rod 43, 45 a sliding plate attached to the fixing means 44 and movable from a position shown by a solid line in FIG. 7 to a vertical position shown by a two-dot chain line in FIGS. 8 and 9. Reference numeral 46 denotes a screw for securing the sliding plate 45, 47 a supporting means attached rotatably to the sliding plate 45, 48 a screw for attaching the supporting means 47 to the sliding plate 45, 49 a movable plate secured to the supporting means 47, 50 a screw for securing the movable plate 49, 51 a pedestal attached to the movable plate, 52 a pin attached to the lower surface of the above mentioned pedestal 51 and adapted to push the upper surface of the printed circuit board 3, and 53 a fitting screw fitted to the upper surface of the pedestal 51 and slidably inserted in a long hole 49a formed in the movable plate 49 so that the pedestal 51 may be set at any desired position between a position shown by a solid line and another position shown by a two-dot chain line. Reference numeral 54 denotes a nut for fixing the pedestal 51, 55 a bolt for mounting the means 41 for correcting upward warp of the circuit board 3 onto the sliding plate 20, 56 pipes adapted to introduce and exhaust air or the like fluid alternately for actuating the rod 43, and 57 a sliding means having mounted thereto the means 9 for correcting downward warp of the circuit board and the means 41 for correcting upward warp of the circuit board. By the way, the pin 52 may be mounted directly onto the movable plate 49.

The operation of the means 41 for correcting upward warp of the circuit boards will now be described below. An explanation on the operation of the sliding means 57 is omitted herein, since its operation is same as that of the sliding means 27 shown in FIG. 1.

The nut 54 of the means 41 for correcting upward warp of the circuit board is loosened and then the pin 52 is set so as to contact with the printed circuit board 3 in a predetermined position. Simultaneously with the detection of the printed circuit board 3 by means of the first detector 32, the rod 43 is actuated so as to lower the sliding plate 45 to a position shown by a two-dot chain line in FIG. 7 to allow the lower end of the pin 52 to contact with and push the upper surface of the printed circuit board 3. When the printed circuit board 3 is being soldered, it is possible to prevent the printed circuit board 3 from upward warping or straighten the upwardly warped printed circuit board 3.

Figure 10:
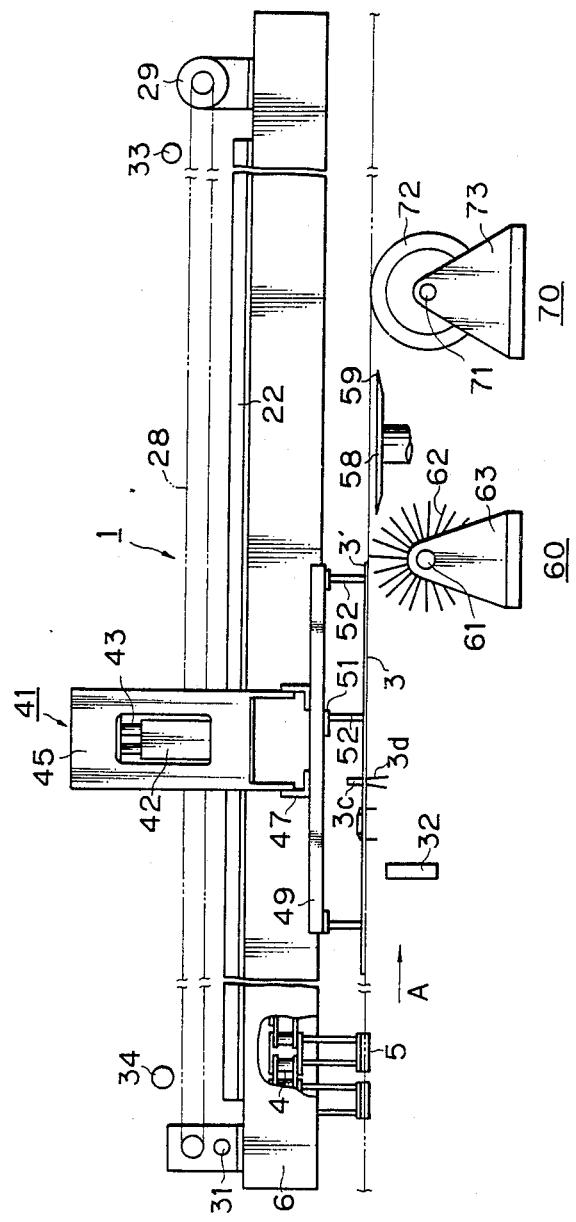
FIG. 10 is a side view showing still another embodiment of the device of this invention provided with a combination of the upward warp-correcting means and the downward warp-correcting means wherein the downward warp-correcting means are conventional ones provided in front of a cutter.

In contrast to FIG. 6 showing the soldering apparatus provided with a combination of the upward warp-correcting means and the downward warp correcting means installed on the slide bed, FIG. 10 shows the soldering apparatus provided with the upward warp-correcting means 41 alone in combination with the conventional downward warp-straightening means. In FIG. 10, the device of this invention provided with the upward warp-correcting means 41 is used after the soldering treatment but prior to the cutting treatment. In this case, the means 41 is used as an upward warp-straightening means for thermally deformed soldered circuit boards. As a matter of course, the device of this invention may be used to prevent the formation of any upward warp in printed circuit boards during the soldering treatment. For this purpose, the device of this invention used in FIG. 1 or 2 for correcting downward warp of printed circuit boards may be replaced with the device provided with the upward warp-correcting means as shown in FIGS. 7–9.

Figure 11:
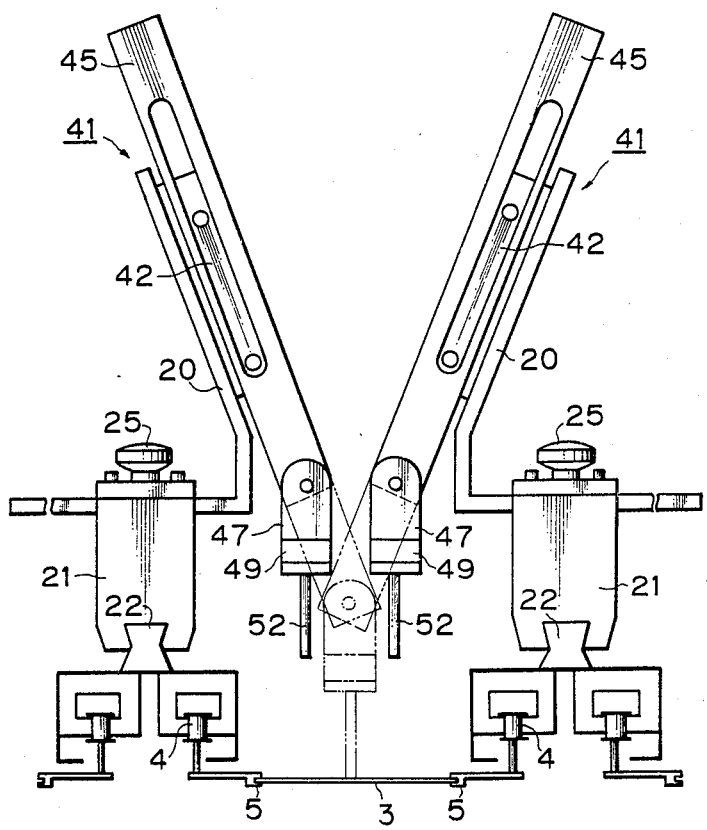
FIG. 11 is a front view showing the arrangement of a pair of the upward warp-correcting means.

FIG. 11 is a side view of a pair of the upward warp-correcting means 41 installed on a pair of the slide beds 21. This device corresponds to that shown in FIG. 3 except that the upward warp-correcting means 41 are used in a pair in FIG. 11. In the same manner as shown in FIG. 3, the warp-correcting means 41 are installed obliquely on the slide beds 21 to prevent the two means 41 from any collision against each other when the sliding means 27 on both sides are moved in opposite direction to each other. In case only one means 41 is used, either of the means installed on both sides may be omitted.

According to the present invention, downward and/or upward warp of printed circuits caused by heat of the molten solder can effectively be prevented and moreover, downwardly and/or upwardly warped circuit boards can be straightened simultaneously. In addition, the upper surface of the printed circuit boards is never wetted with the molten solder. As the treated circuit boards are not thermally deformed and stained, the quality of the resultant products can be enhanced remarkably. According to this invention, the position of the warp-correcting means can be adjusted freely in compliance with the size of the printed circuit boards to be treated by slidably moving the sliding plates and the slide beds. Thus, the device of this invention can easily be fitted in and released from printed circuit boards, thus bringing about such advantage that the time required for soldering treatment can significantly be shortened to increase productivity. According to the device of this invention, further advantage can be obtained in that the circuit boards can effectively be prevented from any warping during the soldering treatment to keep the boards flat so that redundant lead wires extending from the lower surface of the soldered circuit boards can uniformly be cut off in the subsequent after-treatment.

As the warp-correcting device of this invention succeeds in overcoming all the drawbacks as seen in the known conventional devices by a combination of the specified parts and requires no extra expenses for its production, the device of this invention finds a wide advantageous utility, especially in electronic industry.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is Claimed is:

1. A device for correcting warp of printed circuit boards in a carrierless soldering apparatus wherein the printed circuit boards are soldered while being held by holding claws of a conveying means, which comprises a sliding means involving a single or plural warp-correcting means, sliding plates for installing the warp-correcting means thereon, and a single or plural pairs of slide beds provided in parallel to the direction of movement of the printed circuit boards, and a driving means for reciprocating the sliding means in parallel to the direction of movement of the printed circuit boards 2. A device according to claim 1, wherein the sliding plates are mounted onto the slide beds in such manner that the sliding plates are slidably movable in the lateral direction relative to the direction of movement of the printed circuit boards.

3. A device according to claim 1, wherein the warp-correcting means is a means for correcting downward warp of printed circuit boards and comprises warp-correcting rods each having a supporting portion formed at the lower end thereof and adapted to contact with the lower surface of the printed circuit board at both lateral edge portions thereof transverse to the direction of movement of the circuit board, a reciprocating unit for moving each warp-correcting rod up and down axially, and a turning unit for turning the warp-correcting rod around the axis thereof.

4. A device according to claim 1, wherein the warp-correcting means is a means for correcting upward warp of printed circuit boards and comprises one or more pins for pushing the upper surface of the printed circuit boards downwardly, a vertically movable plate for mounting the pin or pins thereto, and a driving means for moving the movable plate up and down.

5. A device according to claim 3, wherein the warp-correcting means further includes a means for correcting upward warp of printed circuit boards comprising one or more pins for pushing the upper surface of the printed circuit boards downwardly, a vertically movable plate for mounting the pin or pins thereto, and a driving means for moving the movable plate up and down, the combination of warp-correcting means being arranged on the same sliding means or on adjacent sliding means.

6. A device according to any one of claims 1–4 and 5 wherein the slide beds are providing with a means for adjusting the space between them.

* * * * *